(12) United States Patent
Koparal et al.

(10) Patent No.: US 9,211,563 B2
(45) Date of Patent: Dec. 15, 2015

(54) COATING APPARATUS AND METHOD

(75) Inventors: Erkan Koparal, Nidderau (DE); Andreas Kloeppel, Glauburg (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/000,369

(22) PCT Filed: Feb. 21, 2012

(86) PCT No.: PCT/EP2012/052935
§ 371 (c)(1),
(2), (4) Date: Oct. 14, 2013

(87) PCT Pub. No.: WO2012/113792
PCT Pub. Date: Aug. 30, 2012

(65) Prior Publication Data
US 2014/0044880 A1    Feb. 13, 2014

(30) Foreign Application Priority Data

Feb. 21, 2011  (EP) .................................. 11155238

(51) Int. Cl.
*B05C 13/00*   (2006.01)
*B05D 7/00*    (2006.01)
*C23C 14/56*   (2006.01)
(Continued)

(52) U.S. Cl.
CPC . *B05C 13/00* (2013.01); *B05D 7/56* (2013.01); *C23C 14/568* (2013.01); *H01L 21/6776* (2013.01); *H01L 21/67173* (2013.01); *H01L 21/67712* (2013.01)

(58) Field of Classification Search
None
See application file for complete search history.

(56) References Cited

U.S. PATENT DOCUMENTS

| 4,526,670 | A  | * | 7/1985 | Hajj .......................... 204/298.35 |
| 2007/0137793 | A1 | * | 6/2007 | Lee et al. ................. 156/345.31 |
| 2007/0144889 | A1 |   | 6/2007 | Koparal et al. |

FOREIGN PATENT DOCUMENTS

| EP | 1956111 A1 | 8/2008 |
| FR | 2230167 | * 12/1974 |
| FR | 2230167 A5 | 12/1974 |

(Continued)

OTHER PUBLICATIONS

International Search Report, PCT/EP2012/052935, Jul. 5, 2012.
(Continued)

*Primary Examiner* — Dah-Wei D Yuan
*Assistant Examiner* — Jethro M Pence
(74) *Attorney, Agent, or Firm* — Patterson & Sheridan, LLP

(57) ABSTRACT

A substrate processing system for processing an essentially vertically oriented substrate is described. The system includes a first processing chamber having a first processing region to deposit a first layer comprising a first material, a second processing chamber having a second processing region to deposit a second layer over the first layer, the second layer comprising a second material, a third processing chamber having a third processing region to deposit a layer comprising the second material, a transfer chamber providing essentially linear transport paths with the first, second, and third chambers, respectively, and a chamber comprising a first and a second transportation track, wherein at least one of the first and second transportation tracks forms an essentially linear transportation path with the first processing chamber, wherein the first chamber is adapted to receive the substrate from the transfer chamber, and to deposit a further layer comprising the first material.

21 Claims, 7 Drawing Sheets

(51) Int. Cl.
*H01L 21/67* (2006.01)
*H01L 21/677* (2006.01)

(56) References Cited

FOREIGN PATENT DOCUMENTS

| JP | 2007-039157 A | 2/2007 |
|---|---|---|
| WO | 2010000503 A1 | 1/2010 |
| WO | WO2010/000503 A1 * | 1/2010 ............. C23C 14/56 |
| WO | WO2010/000503 A1 * | 1/2010 ............. C23C 14/56 |

OTHER PUBLICATIONS

EPO Office Action dated May 28, 2013 for European Application No. 11155238.6-1353.
European Office Action dated Aug. 28, 2015 for Application No. 12706232.1-1353.

* cited by examiner

COATING APPARATUS AND METHOD

BACKGROUND OF THE INVENTION

1. Field of the Invention

Embodiments of the present invention generally relate to processing systems and methods of operating thereof. Particularly, they relate to utilization of process chambers in a processing system, e.g., for multi-layer stack deposition. Specifically they relate to a substrate processing system and a method of depositing a layer stack in a substrate processing system

2. Description of the Related Art

In a number of technical applications layers of different materials are deposited onto each other over a substrate. Typically, this is done in a sequence of coating or deposition steps, wherein other processing steps like etching or structuring might also be provided before, between, or after the various deposition steps. For example, a multi-layer stack with a sequence of "material one"-"material two"-"material one" can be deposited. Due to different coating rates in different process steps and due to different thicknesses of the layers, the processing time in the processing chambers for depositing different layers may vary considerably.

In order to deposit a multiple layer stack, a number of configurations of processing chambers can be provided. For example, in-line arrangements of deposition chambers can be used as well as cluster arrangements of deposition chambers. A typical cluster arrangement comprises a central handling chamber and a number of processing or deposition chambers connected thereto. The coating chambers may be equipped to carry out the same or different processes. A typical in-line system includes a number of subsequent processing chambers, wherein processing steps are conducted in one chamber after the other such that a plurality of substrates can continuously or quasi-continuously be processed with the in-line system. However, whereas the handling of the process in in-line systems is quite easy, the processing time is determined by the longest processing time. Therefore, the efficiency of the process is affected. Cluster tools, on the other hand, allow for different cycle times. However, the handling may be quite complex, which requires an elaborate transfer system provided in the central handling chamber.

The above disadvantages of an in-line system could be compensated for by providing additional chambers. However, this would increase the cost of the equipment, which can be particularly relevant if expensive materials are deposited.

SUMMARY

In light of the above, a substrate processing system for processing an essentially vertically oriented substrate according to independent claim 1 and a method of depositing a layer stack in a substrate processing system according to independent claim 12 are provided.

Embodiments of the invention provide systems and methods of operating thereof, wherein an essentially vertically oriented substrate is processed in a processing system, for example, a system including in-line a processing system portions, such as a hybrid system between an inline-processing system and a cluster processing system, and at least one chamber is utilized at least twice. Thereby, the number of chambers, particularly of transfer chambers and deposition chambers, is reduced in order to avoid equipment costs.

According to another embodiment, a substrate processing system for processing an essentially vertically oriented substrate is provided. The system includes a first processing chamber having a first processing region and being adapted to deposit a first layer comprising a first material, a second processing chamber having a second processing region and being adapted to deposit a second layer over the first layer, the second layer comprising a second material, a third processing chamber having a third processing region and being adapted to deposit a layer comprising the second material, a transfer chamber providing essentially linear transport paths with the first, the second, and the third chambers, respectively, and a further chamber comprising a first and a second transportation track, wherein at least one of the first and second transportation tracks forms an essentially linear transportation path with the first processing chamber, wherein the first chamber is adapted to receive the substrate from the transfer chamber, and to deposit a further layer comprising the first material.

According to another embodiment, a method of depositing a layer stack in a substrate processing system having a first, a second and a third processing chamber is provided. The method includes depositing a first layer comprising a first material in the first processing chamber over an essentially vertically oriented substrate, depositing a second layer comprising a second material in one chamber selected from: the second processing chamber and the third processing chamber, wherein the second processing chamber and the third processing chamber are used in an essentially alternating manner, and depositing a third layer comprising the first material in the first processing chamber, wherein the first, the second and the third processing chambers are connected to a transfer chamber with essentially linear transport paths.

BRIEF DESCRIPTION OF THE DRAWINGS

So that the manner in which the above recited features of the present invention are attained and can be understood in detail, a more particular description of the invention, briefly summarized above, may be had by reference to the embodiments thereof, which are illustrated in the appended drawings.

Figure 1:
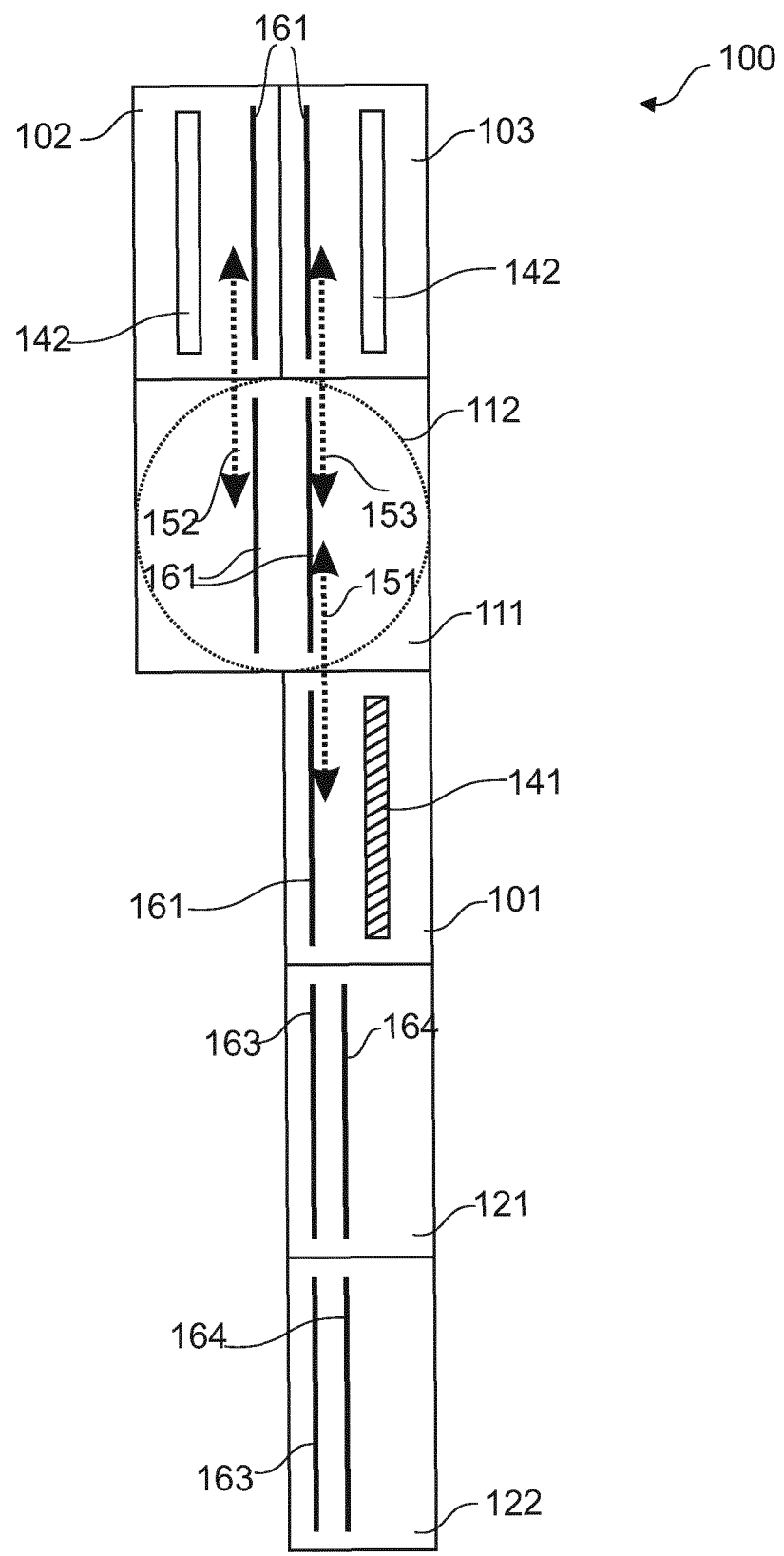
FIG. 1 is a schematic view of a substrate processing system having 3 deposition chambers, a transfer chamber providing linear transportation paths with the processing chambers and a dual transportation track system, according to embodiments described herein.

To facilitate understanding, identical reference numerals have been used, where possible, to designate identical or similar elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

The term "substrate" as used herein shall embrace substrates, such as glass substrates. Thereby, the substrates are typically large area substrates with a size of 1.4 m² and above, typically 5 m² and above. For example, substrate sizes of 1.43 m² (Gen5) and above, such as 5.5 m² (Gen8.5), 9 m² (Gen10) or larger can be realized. Typically, the substrates are essentially vertically-oriented. Thereby, it is to be understood that a vertically oriented substrate can have some deviation from a vertical, i.e., 90°, orientation in a processing system in order to allow for stable transport with an inclination by a few degrees, i.e., the substrates are essentially vertically oriented.

In-line processing systems typically provide a sequence of chambers for depositing a sequence of layers. Thereby, one layer after the other is deposited in one chamber after the other. For example, a thin layer of molybdenum can be deposited over a substrate, subsequently a thick layer of aluminum is deposited over the molybdenum layer and a further thin layer of molybdenum is deposited over the aluminum layer. Thereby, a first chamber including a molybdenum deposition source can be provided. Thereafter, two deposition chambers for depositing aluminum can be provided. Thereafter, another chamber for depositing molybdenum is provided. Thereby, substrates in an in-line processing system can be transferred into the first aluminum chamber and the second aluminum chamber in an alternating manner, such that the deposition of the thicker aluminum layer is less limiting for the overall throughput in the in-line deposition system. However, a deposition source for depositing molybdenum, for example, a molybdenum sputtering target, can be very expensive, particularly for processing large area substrates. Accordingly, four chambers are utilized in the above-described processing system and two chambers with very expensive deposition sources, for example, sputtering targets, need to be provided.

The above described processing system provides four chambers for depositing three layers. According to embodiments described herein, a reduced number of deposition chambers and, thus, an improved utilization of deposition chambers, can be provided. For the above example, three deposition chambers can be provided for depositing the three layers, for example, molybdenum-aluminum-molybdenum.

According to typical embodiments, which can be combined with other embodiments described herein, the deposition sources are provided as sputtering targets, such as rotatable sputtering targets. According to typical implementations thereof, a DC sputtering, a pulse sputtering, or an MF sputtering can be provided. According to yet further embodiments, which can be combined with other embodiments described herein, the middle frequency sputtering with frequencies in the range of 5 kHz to 100 kHz, for example, 30 kHz to 50 kHz, can be provided.

FIG. 1 illustrates an embodiment of a deposition system 100. The system includes the first deposition chamber 101, a second deposition chamber 102, and a third deposition chamber 103. Further, the system includes a transfer Chamber 111, which is configured for transferring substrates from the first deposition chamber 101 to one of the second or third deposition chambers 102/103. Further, the transfer chamber 111 is configured for transferring the substrate from one of the second or third deposition chambers 102/103 to the first deposition chamber 101.

As shown in FIG. 1, the first deposition chamber 101 has a first deposition source 141, and the second deposition chamber 102 and the third deposition chamber 103 each have another deposition source 142. Typically, the deposition sources 142 in the second and the third chamber can be a similar deposition source such that the second deposition chamber 102 and the third deposition chamber 103 can be used in an alternating manner. According to typical embodiments, which can be combined with other embodiments described herein, the deposition sources are provided as sputtering targets, such as rotatable sputtering targets.

Thereby, in the event the deposition with the deposition source 142 is a limiting factor for the throughput of the in-line processing system 100, the overall throughput can be increased because substrates, which are continuously or quasicontinuously processed in the processing system, can be processed in the second and third deposition chambers 102 and 103 in an alternating manner. For example, this can be the case if the layer to be deposited with the deposition source 142 is a thick layer or if the deposition rate of a deposition source 142 is low.

According to embodiments described herein, the transfer chamber 111 and the respective first, second, and third deposition chambers 101, 102, and 103 are connected via linear transport paths 151, 152, and 153, respectively. Thereby, for example, large area substrates which are typically used for display manufacturing can be transported in the processing system 100. Typically, the linear transport paths 151, 152, and 153 are provided by transportation tracks 161, such as linear transportation tracks having, e.g., a plurality of rollers arranged along a line. According to typical embodiments, the transportation tracks 161 can be provided by a transportation system at the bottom of the large area substrates and a guiding system at the top of the essentially vertically oriented large area substrates.

According to yet further embodiments, which can be combined with other embodiments described herein, the transfer chamber 111 can be a rotation module, particularly a vacuum rotation module, which is configured for rotation of the substrates with respect to a vertical rotational axis. This rotation is indicated by reference numeral 112. Thereby, a substrate entering the transfer chamber 111 via the transportation path 151 can be further transferred to the third deposition chamber 103 via transportation path 153 without a rotation in the transfer chamber 111. A substrate which enters the transfer chamber 111 via the transportation path 151 can be a rotated within the transfer chamber 111 in order to enter the chamber 102 via transportation path 152. A transfer out of the second and third deposition chambers 102, 103 to the chamber 111 can be conducted with or without a corresponding rotation, respectively.

As described above, the arrangement of the respective first, second and third deposition chambers 101, 102, and 103 in combination with the transfer chamber 111 can be used to improve the utilization of a plurality of deposition chambers, particularly of the first deposition chamber 101. Accordingly, if the first deposition chamber 101 is configured for deposition of expensive materials such as a molybdenum-containing material, a platinum-containing material, a gold-containing material, or a silver-containing material, an operator of the processing system 100 needs to purchase only one set of deposition sources of the expensive kind. Accordingly, the value of targets that need to be held on stock in order to enable short downtimes can be reduced.

According to embodiments described herein, the in-line processing system 100 includes an improved utilization of the processing chambers and allows for feeding of the substrates into the processing system in a continuous or quasicontinuous manner. Thereby, the further chamber 121 and the yet further chamber 122 are provided with a first and a second transportation track 163 and 164, respectively.

The set of transportation tracks is configured for a lateral movement of a substrate within the chamber 121. Thereby, the substrate can be moved essentially horizontally such that a displacement along a direction perpendicular to the transportation paths.

According to typical embodiments, which can be combined with other embodiments described herein, the chamber 122 can be a load lock chamber for inserting the substrates into the processing system 100 and for discharging the substrates out of the processing system. Further, the chamber 121 can be a chamber selected from the group consisting of: a buffer chamber, a heating chamber, a transfer chamber, a cycle-time-adjusting chamber, or the like.

According to typical embodiments, the chambers shown exemplarity in FIG. 1 are vacuum chambers, i.e., they are configured for transferring or processing the substrates at the pressure of 10 mbar or below. Thereby, the substrates are locked into or locked out of the chamber 122, which is configured for being evacuated before a vacuum valve between chambers 122 and 121 is opened for further transport of the substrate into the chamber 121 in the processing system 100.

According to different embodiments, several substrates can be processed in the processing system having an in-line processing system portion at the same time.

According to typical embodiments, which can be combined with other embodiments described herein, the improved utilization of deposition chambers can be used for layer stacks, wherein the first layer and another layer, e.g., a final layer, are thin as compared to an intermediate layer. For example, a layer stack can include at least a molybdenum-containing layer, a copper-containing layer, and a molybdenum-containing layer, wherein these three layers included are provided in this order. The layer stack could also include a molybdenum-containing layer, an aluminum-containing layer, and a molybdenum containing layer, wherein these three layers included are provided in this order. Yet, according to further embodiments, the molybdenum-containing layer could also be another layer of the above-described layers including an expensive material.

Figure 2:
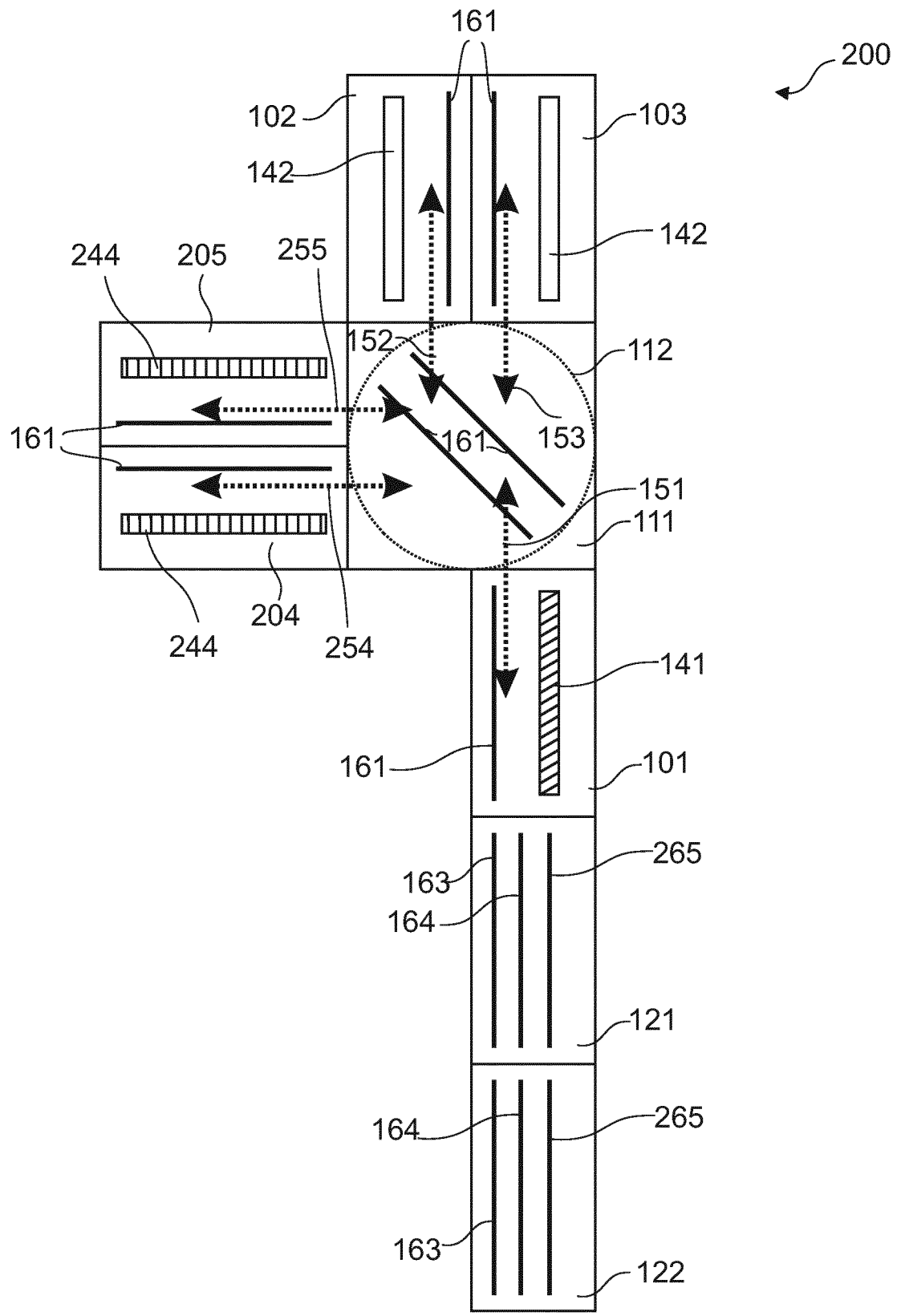
FIG. 2 is a schematic view of a further substrate processing system having several deposition chambers, a transfer chamber providing linear transportation paths with the processing chambers and a dual transportation track system, according to embodiments described herein.

As illustrated with respect to FIG. 2, according to yet further embodiments, which can be combined with other embodiments described herein, a chamber 204 and a chamber 205 can also be provided. Thereby the chambers 204 and 205 can be connected to the transfer chamber 111. Thereby, linear transport paths 254 and 255 are provided. Substrates can be provided in one of the chambers 204 and 205 in an alternating manner such that a layer is deposited with one of the deposition sources 244 which may include a source for a yet further material.

Thereby, according to different implementations, the deposition sources 244 can be of a similar kind such that essentially the same layer can be deposited in chambers 204 and 205, and the chambers 204 and 205 can be used in an alternating manner.

For example, a layer stack can include a thin molybdenum-containing layer, a thick layer comprising a first material, a thick layer comprising a second material, and a thin molybdenum-containing layer. Yet, according to further embodiments, the molybdenum-containing layer could also be another layer of the above-described layers including an expensive material. According to yet alternative embodiments, which can be combined with other embodiments described herein, the chambers 204 and 205 could also be heating chambers for an intermediate heating of the substrates to a desired temperature for the following processing step, e.g. deposition step.

According to another implementation, the deposition sources 244 could be of the same kind as deposition sources 142, such that an intermediate layer could be processed for an even longer time as compared to the embodiments shown in FIG. 1. According to typical embodiments, which can be combined with other embodiments described herein, the deposition sources are provided as sputtering targets, such as rotatable sputtering targets.

According to yet further alternative implementations, the deposition sources 244 could deposit different materials such that a layer stack with more than four layers to be deposited can be manufactured in the system.

According to yet further embodiments, which can be combined with other embodiments described herein, the processing systems, such as the processing system 200 shown in FIG. 2, can also have a transportation system with a first transportation track 163, a second transportation track 164 and one or more further transportation tracks, such as the third transportation track 265, which is shown in chambers 121 and 122 in FIG. 2.

Thereby, the substrates can be transferred from the chamber 122, such as a load lock chamber, in chamber 121, such as a further chamber, or one substrate can be transferred from chamber 121 in the chamber 122 while another substrate is transferred from the chamber 122 in chamber 121. Accordingly, a transfer of substrates can be conducted in a more flexible manner, such that applications for which the transfer of substrates might be a limiting factor for the cycle time can be increased in throughput.

Figure 3:
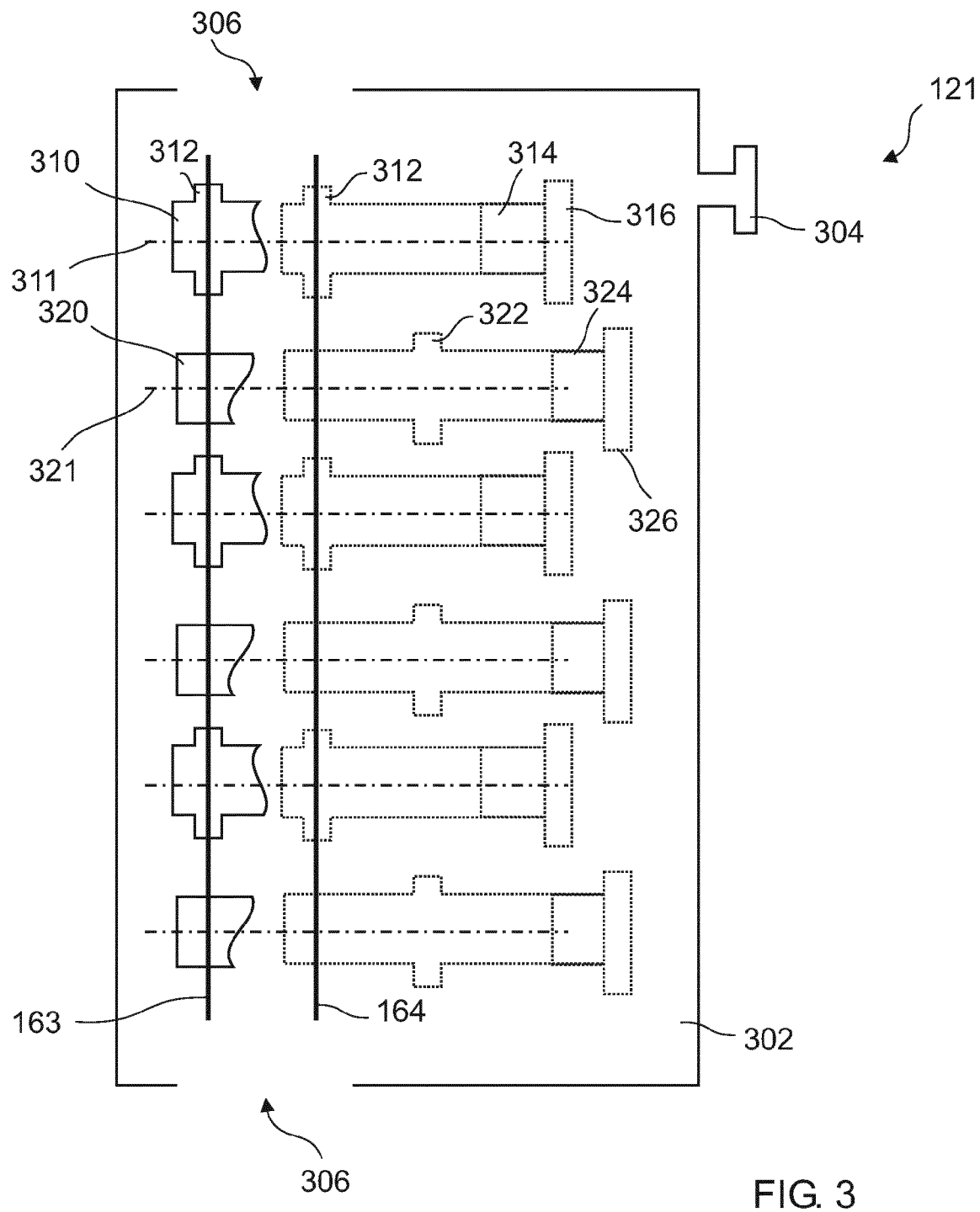
FIG. 3 is a schematic view of a chamber including a dual transportation track system according to embodiments described herein.

An example of the chamber 121 with the first transportation track 163 and the second transportation track 164 is shown in FIG. 3. The chamber 121 has a chamber wall 302 with openings 306. The openings 306 are configured for transfer of the essentially vertically-oriented substrates. Accordingly, the openings 306 can have the shape of a slit. Typically, the openings can be opened and closed with a vacuum valve.

Further, the chamber 121 can have a flange 304 for connection of a vacuum system, such as a vacuum pump or the like. Thereby, the chamber 121 can be evacuated when at least one of the vacuum valves, preferably both vacuum valves for closing the openings 306, are closed.

The substrate transport system or carrier transport system, respectively, having a first transportation track 163 and a second transportation track 164 includes two groups of transportation elements. The transportation elements 310 of the first group of transportation elements include a transportation roller 312. The transportation elements 320 of the second group of transportation elements include a transportation roller 322. The transportation elements 310 are rotatable around the rotation axis 311. The transportation elements 320 are rotatable around the rotation axis 321.

Each of the transportation elements 310 and 320 are illustrated in FIG. 3 in two positions. Thereby, one position is shown with dotted lines. Each of the transportation elements has a bearing element 314 or 324, respectively. The bearing elements are configured for providing the rotation and for providing linear movement along the axis 311 or 321, respectively. The rotation elements can be moved from the first position to the second position (dotted lines) by the linear movement of the bearing element.

As illustrated in FIG. 3, the transportation roller 312 is offset with respect to the transportation roller 322. By the linear movement of the transportation elements, the transportation roller 312 of the transportation elements 310 can move from the first transportation track 163 to the second transportation track 164. Accordingly, by movement of the transportation elements 310 and 320, a substrate, which is positioned in the first transportation track, i.e., on the transportation roller for driving the carrier, can be moved to the second transportation track. Alternatively, a substrate, which is positioned in the second transportation track 164, can be moved to the first transportation track.

The transportation elements 310 and 320, which are illustrated in FIG. 3, provide the substrate support for the essentially vertically oriented substrate, which is adapted to support the substrate at the lower end thereof. According to further embodiments, which can be combined with other embodiments described herein, the substrate transportation system or the carrier transportation system, respectively, can also include an upper transportation means.

Typically, the transportation means is one or more groups of guiding elements for guiding the substrates in one of the first transportation path or the second transportation path. For example, the guiding elements can be magnetic guiding elements having a recess, e.g., two slits, through which the substrate can be transferred. According to yet further embodiments, these guiding elements can also include a bearing for linear movement such that the shift from the first transportation track to the second transportation track can be conducted.

According to typical embodiments, the transportation elements 310 and the transportation elements 320 are moved synchronously for lateral transfer of the essentially vertically oriented substrate within the chamber 121. Typically, the upper elements, such as the guiding elements, are also moved at the same time.

The transportation elements 310 and 320 can further include belt drives 316 and 326 for driving the rotation of the transportation elements in order to transport the substrates or carriers provided on the transportation rollers along the transportation paths. According to some embodiments, which can be combined with other embodiments described herein, one or more of the belt drives can be driven by one motor.

Figure 4:
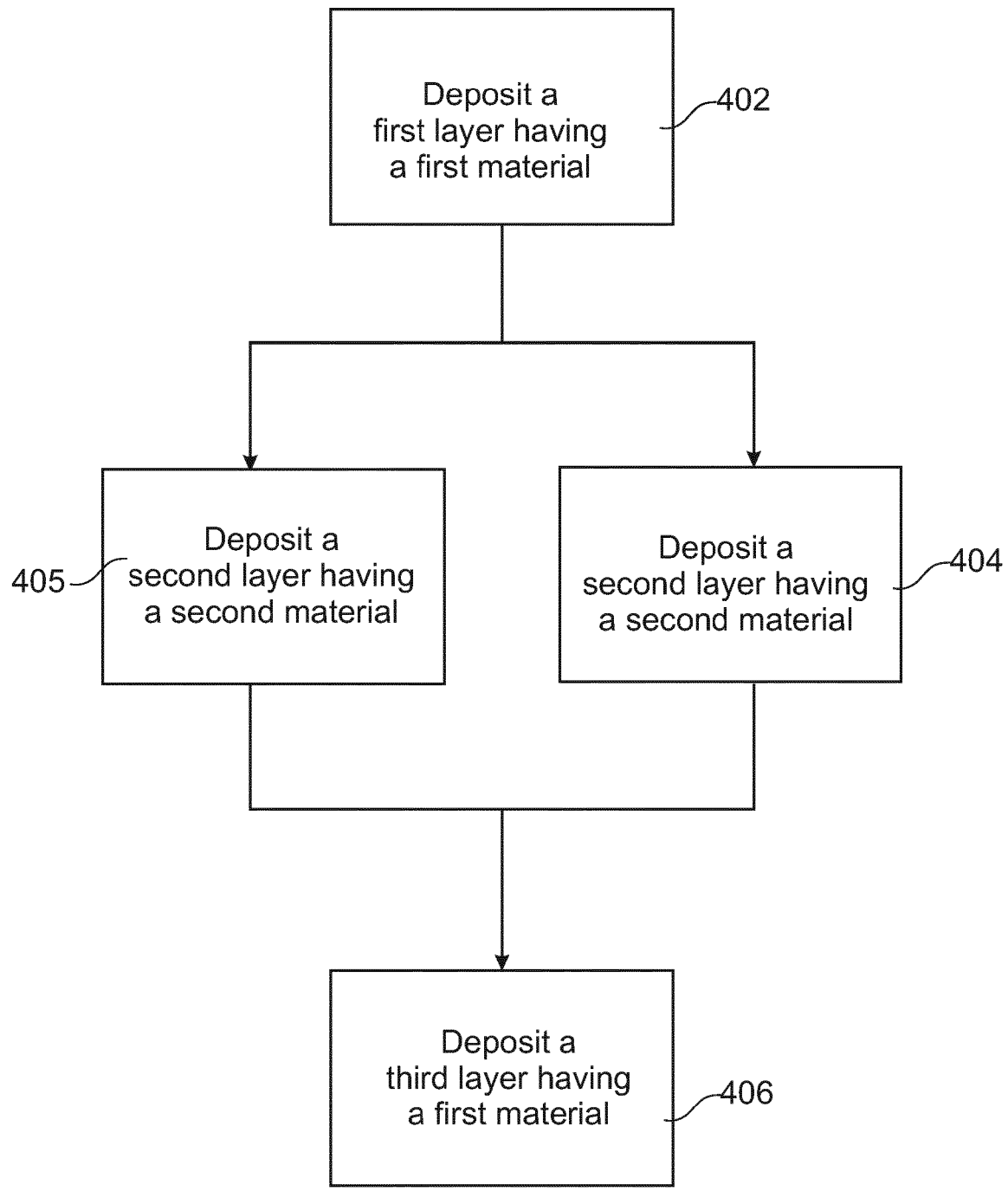
FIG. 4 is a flow chart illustrating methods of depositing a layer stack in a processing system including an in-line substrate processing system portion, according to embodiments described herein.

FIG. 4 illustrates a method of depositing a layer stack in a hybrid system between an inline-processing system and a cluster processing system having an improved utilization of deposition chambers. As shown in FIG. 4, a first layer is deposited in a first chamber in step 402. The first layer can typically include at least one material selected from the group consisting of: molybdenum, platinum, and gold.

Further, the first layer is typically a thin layer or a layer which can be deposited within a time that is short as compared to the deposition time of a second layer. The substrate is then transferred in either the second or the third chamber such that the second layer can be either deposited in the second chamber in step 404 or third chamber in step 405.

Thereby, the steps 404 and 405 can be conducted in an alternating manner. In light of the longer deposition time in the second or the third chamber, the deposition system is not unnecessarily limited in throughput by the longer deposition step. In step 406 another layer comprising the same material as the first layer (see step 402) is deposited. Step 406 is conducted in the same chamber as step 402. Thereby, an improved utilization of deposition chambers is provided.

Figure 5:
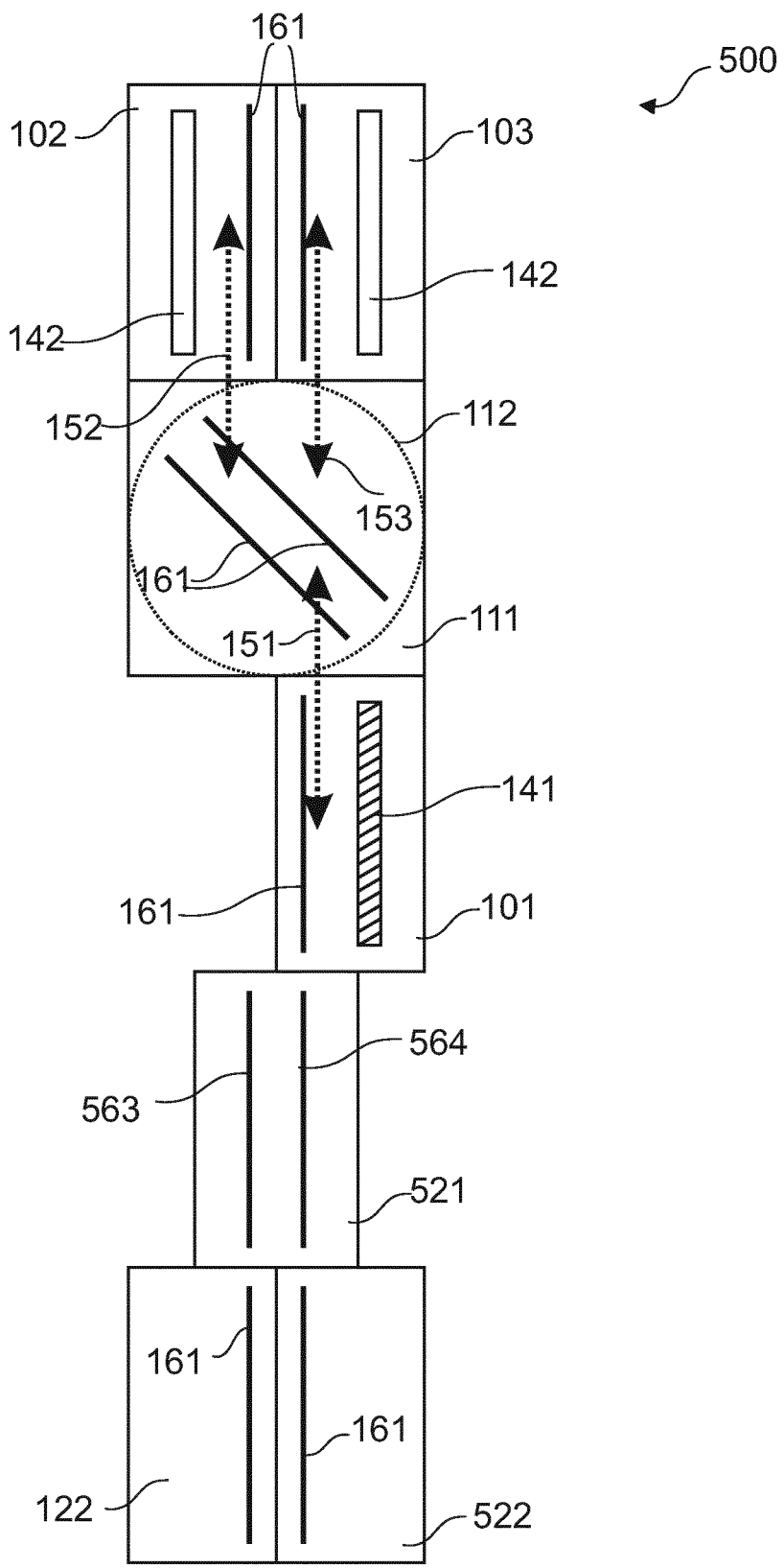
FIG. 5 is a schematic view of another substrate processing system having several deposition chambers, a transfer chamber providing linear transportation paths with the processing chambers, and a dual transportation track system, according to embodiments described herein.

FIG. 5 illustrates another embodiment of a deposition system 100. The system includes the first deposition chamber 101, a second deposition chamber 102, and a third deposition chamber 103. Further, the system includes a transfer chamber 111, which is configured for transferring substrates from the first deposition chamber 101 to one of the second or third deposition chambers 102/103. Further, the transfer chamber 111 is configured for transferring the substrate from one of the second or third deposition chambers 102/103 to the first deposition chamber 101.

As shown in FIG. 5, the first deposition chamber 101 has a first deposition source 141, and the second deposition chamber 102 and the third deposition chamber 103 each have another deposition source 142. Further details have been described with respect to FIG. 1 above.

According to embodiments described herein, the transfer chamber 111 and the respective first, second, and third deposition chambers 101, 102, and 103 are connected via linear transport paths 151, 152, and 153, respectively. Thereby, for example, large area substrates which are typically used for display manufacturing can be transported in the in-line processing system 100. Typically, the linear transport paths 151, 152, and 153 are provided by transportation tracks 161 such as linear transportation tracks having, e.g., a plurality of rollers arranged along a line. According to typical embodiments, the transportation tracks 161 can be provided by a transportation system at the bottom of the large area substrates and a guiding system at the top of the essentially vertically-oriented large area substrates.

According to yet further embodiments, which can be combined with other embodiments described herein, the transfer chamber 111 can be a rotation module, particularly a vacuum rotation module, which is configured for rotation of the substrates with respect to a vertical rotational axis. This rotation is indicated by reference numeral 112. Thereby, a substrate entering the transfer chamber 111 via the transportation path 151 can be further transferred to the third deposition chamber 103 via transportation path 153 without a rotation in the transfer chamber 111. A substrate which enters the transfer chamber 111 via the transportation path 151 can be a rotated within the transfer chamber 111 in order to enter the second deposition chamber 102 via transportation path 152. A transfer out of the second, third deposition chambers 102, 103 to the chamber 111 can be conducted with or without a corresponding rotation, respectively.

As described above, the arrangement of the respective first, second, and third deposition chambers 101, 102 and 103 in combination with the transfer chamber 111 can be used to improve the utilization of a plurality of deposition chambers, particularly of the first deposition chamber 101. Accordingly, if the first deposition chamber 101 is configured for deposition of expensive materials such as a molybdenum-containing material, a platinum-containing material, a gold-containing material, or a silver-containing material, an operator of the processing system 100 needs to purchase only one set of deposition sources of the expensive kind. Accordingly, the value of targets that need to be held on stock in order to enable short downtimes can be reduced.

According to embodiments described herein, the hybrid system 100 between an inline-processing system and a cluster processing system includes an improved utilization of the processing chambers and allows for feeding of the substrates into the processing system in a continuous or quasi-continuous manner. As shown in FIG. 5, according to further embodiments, which can be combined with other embodiments described herein, a chamber 521, such as a further chamber, and chambers 122 and 522, such as load lock chambers, are provided in the processing system 500. The chamber 521 has a first and a second transportation track 563 and 564. The set of transportation tracks is configured for lateral movement of a substrate within the chamber 521. Thereby, the substrate can be moved essentially horizontally such that a displacement along a direction perpendicular to the transportation paths occurs.

Accordingly, the lateral movement of the substrate can be used to transfer the substrates in either one of the first and the second load lock chambers, respectively. As compared to FIG. 1, two load lock chambers are provided, which can be evacuated or vented individually. This might be helpful to further increase the throughput of the processing system.

According to some embodiments, which can be combined with other embodiments described herein, apparatuses, systems and methods described herein, can relate to large area deposition technology, for example, PVD large area deposition technology, particularly to a multilayer deposition tool or apparatus with static deposition process. Typically, it refers to deposition tools and deposition for 3-layer-stacks where first and third layer use the same target material. Thereby, it is desired to have optimum or improved hardware efficiency with maximum or increased throughput. Yet, embodiments are also applicable for deposition tools and deposition for 2-layer-stacks where either the first or third layer of the above-mentioned 3-layer-stack is not needed.

Embodiments described herein can be compared to cluster-tool systems, wherein substrates are transferred through a load-lock area into a central transfer chamber that sequentially directs the substrate in the multiple process chambers that are attached to the central transfer chamber. Thereby, as layer thickness of the typical 3-layer-stacks varies a lot between the different layers, typically at least 4 process chambers need to be used to achieve the typical cycle time of 50 sec and less. Thus substrate handling in the central transfer chamber is getting quite complicated and limits achievable throughput. Embodiments described herein, can also be compared to inline systems, wherein a typical inline system provides multiple process chambers configured one after the other in a row. In this case for 3-layer-stacks either the deposition time of the thickest layer limits the achievable throughput or the deposition of the thickest layer needs to be split into multiple steps in multiple process chambers. The latter case bears the risk of negative implications on layer properties.

According to embodiments described herein, hybrid systems can be provided, wherein a deposition tool combines both above mentioned strategies. The tool consists of an inline section containing a load-lock chamber and a transfer chamber with multiple carrier tracks for increased substrate throughput. A first process chamber for deposition of the first and third layer of the 3-layer stacks can have a single carrier track or a dual carrier track. The cluster-section consists of a central transfer chamber that is typically attached to the first process chamber and at least two other process chambers with identical target material for alternating deposition of the typically thick second layer.

As the first process chamber needs to deposit both the first and the third layer and needs to provide time for multiple carrier transfer into the chamber and out of the chamber this chamber can easily become the bottleneck for substrate throughput. Accordingly, providing a dual track system in the first deposition chamber can improve flexibility of the system and throughput thereof.

In light of the above, additional flexibility can be gained by providing a dual track system, for example as described with respect to chamber 121 in FIG. 3 also for other chambers, e.g. the first deposition chamber, the transfer chamber, or even the second and third and further chambers. Thereby, a substrate can be transferred each in the first and the second track of any of these chambers. Thereby, in order to move forward to a subsequent cycle time, only the processed substrate needs to be removed and the next substrate to be processed is already provided in the chamber. Accordingly, for example, merely a lateral translation mechanism can be used to move the substrate in a deposition position. Yet, according to another perspective, the additional tracks in the deposition chambers and/or the transfer chamber can serve as a puffer for substrates, which are already loaded into the system for processing or which await unloading after processing.

Figure 6:
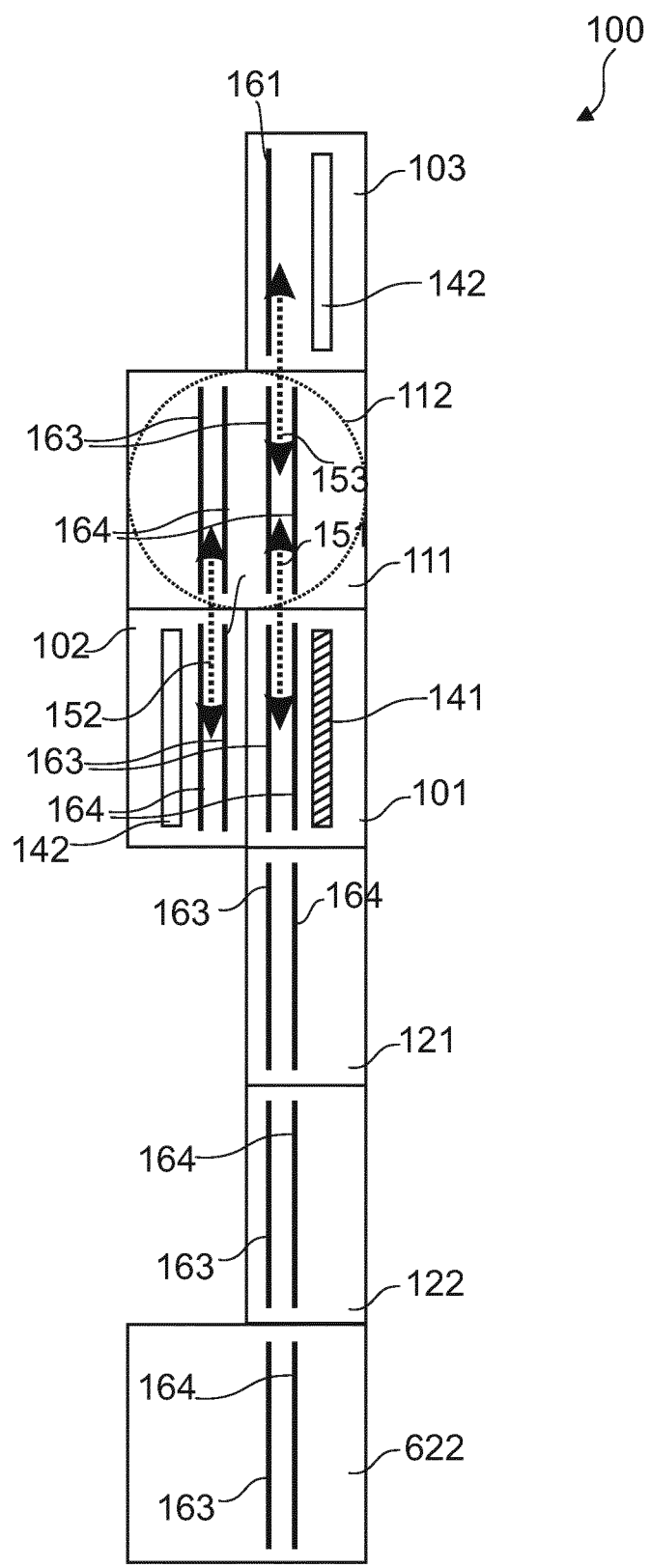
FIG. 6 is a schematic view of another substrate processing system having several deposition chambers, a transfer chamber providing linear transportation paths with the processing chambers, and a dual transportation track system, according to embodiments described herein.

According to some embodiments, which can be combined with other embodiments described herein, a transport system with a first and a second transportation track can be provided in two or more of the chambers, i.e. one or more of the deposition chambers, the transfer chamber, the load-lock chamber and/or the further chamber. Thereby, flexibility and/or throughput can be increased in light of the above, FIG. 6 illustrates yet further embodiments of a deposition system 100. The system is comparable to the embodiments described with respect to FIG. 1 and the embodiments to be combined therewith. The system includes the first deposition chamber 101, a second deposition chamber 102, and a third deposition chamber 103. Further, the system includes a transfer chamber 111, which is configured for transferring substrates from the first deposition chamber 101 to one of the second or third deposition chambers 102/103. Further, the transfer chamber 111 is configured for transferring the substrate from one of the deposition chambers 102/103 to the first deposition chamber 101.

As compared to FIG. 1, the second deposition chamber is connected to the transfer chamber at a different side portion. According to different modifications, the second and/or the third deposition chamber can each be connected at different sides as compared to FIG. 1. Thereby, some chamber transfer combinations might be simplified by a straight transfer path and/or the rotation cycles might be better suitable for some deposition processes as for other deposition processes. Yet, besides the loading or unloading position into and out of the second and/or third deposition chamber, the arrangement of the deposition chambers follow the same concept as compared to FIG. 1

As shown in FIG. 6, and similar to FIG. 6, the first deposition chamber 101 has a first deposition source 141, and the second deposition chamber 102 and the third deposition chamber 103 each have another deposition source 142.

According to embodiments described herein, the transfer chamber 111 and the chambers 101, 102, and 103 are connected via linear transport paths 151, 152, and 153, respectively. Thereby, for example, large area substrates which are typically used for display manufacturing can be transported in the processing system 100. Contrary to the Example shown in FIG. 1, the linear transport path 151 is provided by a dual transportation track system having a first transportation track 163 and a second transportation track 164, such as linear transportation tracks having, e.g., a plurality of rollers arranged along a line. Thereby, the first deposition chamber 101 and the transfer chamber 111 includes dual track transport systems, wherein the transfer module can include a dual track system on both sides of the rotation module. According to yet different modifications, the first deposition chamber 161 can include a dual transportation system for buffering substrates, whereas the transport path 151 is provided by a single track only.

The linear transport paths 152 and 153 are provided by transportation tracks 161 in the chambers 102 and 103, such as linear transportation tracks having, e.g., a plurality of rollers arranged along a line. As illustrated with respect to FIG. 7, also these chambers can be provided with dual track transportation systems.

As described above, the arrangement of deposition chambers 101, 102, and 103 in combination with the transfer chamber 111 can be used to improve the utilization of a plurality of deposition chambers, particularly of the deposition chamber 101. Accordingly, if the deposition chamber 101 is configured for deposition of expensive materials such as a molybdenum-containing material, a platinum-containing material, a gold-containing material, or a silver-containing material, an operator of the processing system 100 needs to purchase only one set of deposition sources of the expensive kind. Accordingly, the value of targets that need to be held on stock in order to enable short downtimes can be reduced. The additional dual track systems provided exemplarily in chambers 101 and 111 can improve throughput and/or flexibility of the system as compared to the system shown in FIG. 1, because the respective second tracks 163/164 can be used as a buffer or to reduce the time for substrate transfer. For example, a transfer of substrates can be conducted simultaneously on both tracks.

Further to FIG. 1, FIG. 6 also shows a swing module 622, where substrates can be handled from a horizontal position to a vertical position for processing in the vertical processing. Typically, the swing module can also include a dual track system. Thereby, an atmosphere rotation module and/or an additional exit chamber can be omitted, as the system includes a dual exit/entrance out of/into the load lock 122. Further, different layer stacks, e.g. Al/Mo and Mo/Al can be manufactured with the same system.

According to embodiments described herein, the first and a second transportation track 163 and 164, respectively, which are provided in one or more of the group of chambers or modules consisting of: a swing module, a load lock chamber, a further chamber provided between a load lock chamber and a first deposition chamber, a first deposition chamber, a transfer chamber, a second deposition chamber, and a third deposition chamber. Thereby, particularly the load lock chamber, the further chamber, the first deposition chamber and/or the transfer chamber are provided with a first and a second transportation track 163 and 164, respectively.

At least one of the chambers having a first and a second transportation track 163 and 164, respectively, particularly all of the chambers having a first and a second transportation track 163 and 164, respectively, are configured for a lateral movement of a substrate within the respective chamber. Thereby, the substrate can be moved essentially horizontally such that a displacement along a direction perpendicular to the transportation paths.

In light of the above, according to some additional or alternative embodiments, an arrangement of second and third process chamber can vary as shown in FIG. 6 as compared to FIG. 1, and/or various chamber can be equipped with multiple substrate tracks. Especially it is regarded to be useful to have additional multiple carrier tracks in the first process chamber and/or the central transfer chamber. Also the second and/or third process chamber can be equipped with multiple carrier tracks. Using multiple carrier tracks also in the above mentioned chambers allows simultaneous carrier transfer into/out of, particularly out of the first process chamber, and in case where also second and/or third process chambers are equipped with multiple carrier tracks, time needed for carrier transfer into/out of those process chambers can be reduced.

Figure 7:
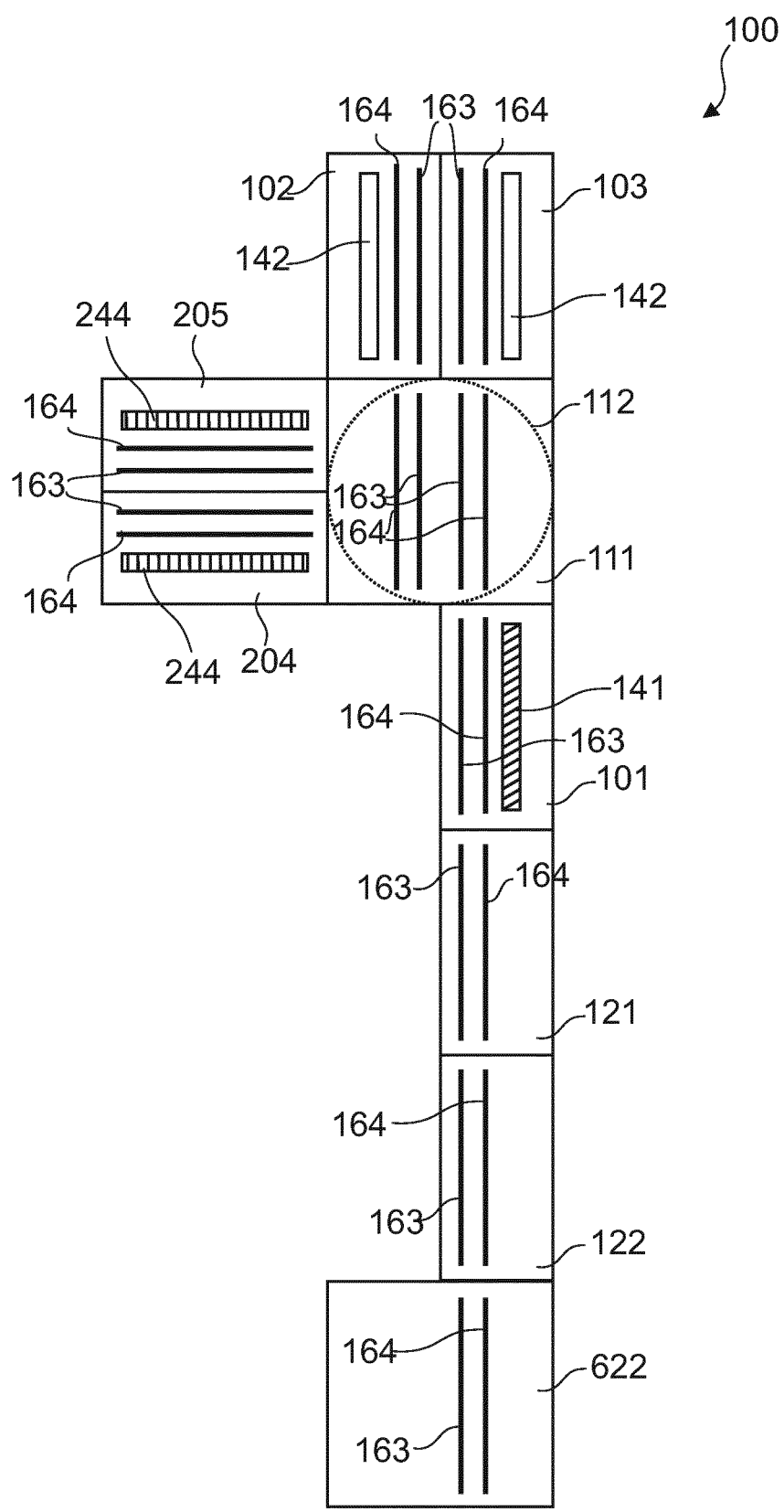
FIG. 7 is a schematic view of another substrate processing system having several deposition chambers, a transfer chamber providing linear transportation paths with the processing chambers, and a dual transportation track system, according to embodiments described herein.

FIG. 7 illustrates exemplarily yet further embodiments. As compared to FIGS. 1 and 2, the swing module as well as the other chambers are provided with a first transportation track and a second transportation track 163 and 164. Yet further, additionally or alternatively to the additional tracks, third and forth deposition chambers 204 and 205 are provided. Even though deposition sources 244 are denoted with a different reference numeral as compared to deposition sources 142, these sources can be similar. Accordingly, more than two chambers for deposition of the second target material can be attached to the transfer chamber, e.g. central transfer chamber. All those chambers for deposition of the second layer can be operated in an alternating manner and can be equipped with either single carrier tracks and/or dual carrier tracks as shown in FIG. 7. This allows deposition of even thicker second layers with increased throughput, particularly without the need to deposit the second layer in several steps, e.g. in several chambers.

The embodiments described herein improve the efficiency of hardware usage, increase the system throughput with a given number of vacuum chambers and/or increase system throughput by using enhanced alternating operation for deposition of the second layer. This is provided by the hybrid system and can be further improved by using multiple carrier tracks not only in the load lock chamber and the transfer chamber but also in other chambers. This reduces the time needed for carrier transfer and provides more time for layer deposition especially of the first and third layer in the first process chamber. Further potential for reducing system cycle time and/or increasing system throughput is provided. Yet further, additionally or alternatively, extremely thick second layers can be deposited by using more than two alternatingly operating process chambers attached to the central transfer chamber.

Accordingly, the embodiments described herein can be utilized for multilayer-deposition tools, e.g. multilayer PVD deposition tool, particularly with static deposition process.

In light of the above a plurality of embodiments are described. For example, according to one embodiment, a substrate processing system for processing an essentially vertically-oriented substrate is provided. The system includes a first processing chamber having a first processing region and being adapted to deposit a first layer comprising a first material, a second processing chamber having a second processing region and being adapted to deposit a second layer over the first layer, the second layer comprising a second material, a third processing chamber having a third processing region and being adapted to deposit a layer comprising the second material, a transfer chamber providing essentially linear transport paths with the first, the second, and the third chambers, respectively, and a further chamber comprising a first and a second transportation track, wherein at least one of the first and second transportation tracks forms an essentially linear transportation path with the first processing chamber, and wherein the first chamber is adapted to receive the substrate from the transfer chamber, and to deposit a further layer comprising the first material. According to further implementations, which can be combined with other embodiments described herein, the transfer chamber can be a rotation module, particularly a vacuum rotation module for rotation substrate under a pressure below 10 mbar; the system can include an inline processing system portion, particularly wherein the system can be a hybrid system between an inline-processing system and a cluster processing system; and/or the system can further include a lateral displacement mechanism configured for lateral displacement of the substrate from the first transportation track to the second transportation track and vice versa. For example, the lateral displacement mechanism can be disposed in the further chamber. According to yet further embodiments, which can be combined with other embodiments and implementations described herein, the system can further include one or more of the following features selected from the group consisting of: the system can further include at least one load lock chamber comprising further portions of each of the first and the second transportation track, wherein the further portions are provided in extension of the first and second transportation track in the further chamber; the system can further include at least one further chamber having a further processing region and being adapted to deposit a further layer comprising a third material, wherein the at last one further chamber is connected to the transfer chamber; the at least one further chamber can be at least two further chambers, each being adapted to deposit the layer comprising the third material; and the first material can be selected from the group consisting of: molybdenum, molybdenum-alloys, platinum, platinum-alloys, gold, gold-alloys, titanium, titanium-alloys, silver, and silver-alloys. For example, the first material can be molybdenum, a molybdenum-alloy, titanium, or a titanium-alloy. According to yet further embodiments, which can be combined with other embodiments and implementations described herein, the system can further include one or more of the following features selected from the group consisting of: the further chamber can include a third transportation track; the first transportation track can include a plurality of guiding elements for guiding in a transport direction, wherein the second transportation track can include a plurality of guiding elements for guiding in the transport direction, and wherein the guiding elements of the first transportation track and the second transportation track are adapted for a first and second guiding position respectively such that the guiding positions are displaced in a direction perpendicular to the transport direction; and the guiding elements of the first transportation rotation track and the guiding elements of the second transportation track can be provided along the transportation direction alternately.

According to a further embodiment, a method of depositing a layer stack in a substrate processing system having a first, a second, and a third processing chamber is provided. The method includes depositing a first layer comprising a first material in the first processing chamber over an essentially vertically oriented substrate, depositing a second layer comprising a second material in one chamber selected from: the second processing chamber and the third processing chamber, wherein the second chamber processing and the third processing chamber are used in an essentially alternating manner, depositing a third layer comprising the first material in the first processing chamber, wherein the first, the second, and the third processing chambers are connected to a transfer chamber with essentially linear transport paths, and laterally displacing a substrate between a first transportation track and a second transportation track in a further chamber.

According to typical modifications thereof the first layer on a first substrate can be deposited while the second layer on another substrate is deposited; the method can further include transferring two substrates simultaneously onto or off the first transportation track and the second transportation track; and/or the first material can be selected from the group consisting of: molybdenum, molybdenum-alloys, platinum, platinum-alloys, gold, gold-alloys, titanium, titanium-alloys, silver, and silver-alloys. For example, the first material can be molybdenum, a molybdenum-alloy, titanium, or a titanium-alloy.

While the foregoing is directed to embodiments of the invention, other and further embodiments of the invention may be devised without departing from the basic scope thereof, and the scope thereof is determined by the claims that follow.

The invention claimed is:

1. A substrate processing system for processing an essentially vertically-oriented substrate, comprising:
   a first processing chamber having a first processing region and being adapted to deposit a first layer comprising a first material, wherein the first process chamber comprises a first and a second transportation track;
   a second processing chamber having a second processing region and being adapted to deposit a second layer over the first layer, the second layer comprising a second material;
   a third processing chamber having a third processing region and being adapted to deposit a layer comprising the second material;
   a transfer chamber providing linear transport paths with the first, the second, and the third chambers, respectively;
   a further chamber comprising further portions of the first and the second transportation track, wherein the further portions of the first and the second transportation track in the further chamber and the first and second transportation track in the first process chamber form linear transportation paths; and
   at least one lateral displacement mechanism configured for lateral displacement of the substrate from the first transportation track to the second transportation track and vice versa, wherein the at least one lateral displacement mechanism is configured for the lateral displacement along a direction perpendicular to the transportation paths, and wherein the at least one lateral displacement mechanism is provided in the further chamber or the first processing chamber, and
   wherein the first processing chamber is adapted to receive the substrate from the transfer chamber, and to deposit a further layer comprising the first material.

2. The system according to claim 1, wherein the transfer chamber is a rotation module.

3. The system according to claim 1, wherein the system comprises an inline processing system portion.

4. The system according to claim 1, further comprising:
   at least one load lock chamber comprising yet further portions of each of the first and the second transportation track, wherein the yet further portions are provided in extension of the first and second transportation track in the further chamber.

5. The system according to claim 1, further comprising:
   at least one yet further chamber having a further processing region and being adapted to deposit a further layer comprising a third material, wherein the at least one yet further chamber is connected to the transfer chamber.

6. The system according to claim 5, wherein the at least one yet further chamber comprises at least two yet further chambers, each being adapted to deposit the layer comprising the third material.

7. The system according to claim 1, wherein the first material is selected from the group consisting of: molybdenum, molybdenum-alloys, platinum, platinum-alloys, gold, gold-alloys, titanium, titanium-alloys, silver, and silver alloys.

8. The system according to claim 1, wherein the further chamber comprises a third transportation track.

9. The system according to claim 1, wherein the first transportation track comprises a plurality of guiding elements for guiding in a transport direction, wherein the second transportation track comprises a plurality of guiding elements for guiding in the transport direction, and wherein the guiding elements of the first transportation track and the second transportation track are adapted for a first and second guiding position respectively such that the guiding positions are displaced in a direction perpendicular to the transport direction.

10. The system according to claim 9, wherein the guiding elements of the first transportation track and the guiding elements of the second transportation track are provided along the transportation direction alternately.

11. The system of claim 7, wherein the first material is molybdenum, a molybdenum-alloy, titanium, or a titanium-alloy.

12. The system according to claim 2, wherein the transfer chamber is a vacuum rotation module for rotating the substrate under a pressure below 10 mbar.

13. The system according to claim 3, wherein the system is a hybrid system between an inline-processing system and a cluster processing system.

14. The system according to claim 1, wherein the at least one lateral displacement mechanism includes a first group of first transportation elements for moving along either the first or the second transportation path and configured for a linear movement in the direction perpendicular to the transportation paths from the first transportation track to the second transportation track and vice versa, and a second group of second transportation elements, which are offset from the first transportation elements, for moving along either the first or the second transportation path and configured for a linear movement in the direction perpendicular to the transportation paths.

15. The system according to claim 14, wherein the first transportation elements of the first group include first transportation rollers and the second transportation elements of the second group include second transportation rollers, wherein the first transportation elements are rotatable around first rotation axes and the second transportation elements are rotatable around second rotation axes.

16. The system according to claim 15, wherein each of the first transportation elements of the first group has a first bearing element and each of the second transportation elements of the second group has a second bearing element, wherein the first bearing elements and the second bearing elements are configured for providing the rotation around the first rotation axes and the second rotation axes, respectively.

17. The system according to claim 16, wherein the first bearing elements and the second bearing elements provide the linear movement in the direction perpendicular to the transportation paths along the first rotation axis and the second rotation axis, respectively.

18. The system according to claim 15, wherein the first transportation rollers of the first transportation elements of the first group is configured to be moved from the first transportation track to the second transportation track and vice versa by the linear movement of the first transportation elements of the first group.

19. The system according to claim 14, wherein the first transportation elements of the first group and the second transportation elements of the second group can each be moved synchronously for moving the substrate from the first transportation track to the second transportation track and vice versa.

20. The system according to claim 15, wherein the second transportation rollers are offset with respect to the first transportation rollers.

21. The system according to claim 1, wherein at least one of the first process chamber, the second process chamber and the third process chamber is provided with multiple carrier tracks.

* * * * *

UNITED STATES PATENT AND TRADEMARK OFFICE
CERTIFICATE OF CORRECTION

| | | |
|---|---|---|
| PATENT NO. | : 9,211,563 B2 | Page 1 of 1 |
| APPLICATION NO. | : 14/000369 | |
| DATED | : December 15, 2015 | |
| INVENTOR(S) | : Koparal et al. | |

It is certified that error appears in the above-identified patent and that said Letters Patent is hereby corrected as shown below:

In the specification

Column 10, Lines 33-34, delete "can be increased in light of the above"

and insert --can be increased in light of the above-- therefor;

Column 12, Line 17, delete "forth" and insert --fourth-- therefor.

Signed and Sealed this
Tenth Day of May, 2016

Michelle K. Lee
*Director of the United States Patent and Trademark Office*